(12) United States Patent
Kurozumi et al.

(10) Patent No.: US 7,830,710 B2
(45) Date of Patent: Nov. 9, 2010

(54) SEMICONDUCTOR MEMORY DEVICE

(75) Inventors: Tomohiro Kurozumi, Kyoto (JP);
Hironori Akamatsu, Osaka (JP);
Katsuji Satomi, Osaka (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 12/363,084

(22) Filed: Jan. 30, 2009

(65) Prior Publication Data

US 2010/0195424 A1    Aug. 5, 2010

(51) Int. Cl.
*G11C 11/34* (2006.01)
*G11C 16/06* (2006.01)
*G11C 7/00* (2006.01)
*G11C 29/00* (2006.01)

(52) U.S. Cl. ............... 365/185.09; 365/200; 365/201
(58) Field of Classification Search ............ 365/185.09, 365/200, 201
See application file for complete search history.

(56) References Cited

U.S. PATENT DOCUMENTS

| 5,917,764 | A | 6/1999 | Ohsawa et al. | |
| 6,877,118 | B2* | 4/2005 | Oshima et al. | 714/719 |
| 2002/0196683 | A1* | 12/2002 | Ohtani et al. | 365/200 |
| 2004/0208070 | A1* | 10/2004 | Nagata et al. | 365/201 |
| 2004/0261049 | A1* | 12/2004 | Mohr et al. | 716/16 |
| 2006/0007739 | A1* | 1/2006 | Takeda et al. | 365/185.09 |
| 2007/0008772 | A1* | 1/2007 | Hidaka | 365/158 |

FOREIGN PATENT DOCUMENTS

| JP | 11-016390 | 1/1999 |
| JP | 2003-036696 | 7/2003 |
| JP | 2008-021376 | 1/2008 |

* cited by examiner

*Primary Examiner*—Ly D Pham
(74) *Attorney, Agent, or Firm*—McDermott Will & Emery LLP

(57) ABSTRACT

In a semiconductor memory device 100, a non-volatile element section 4 stores information necessary for rescuing a main memory cell, as storage information, in a non-volatile element. When rescue information S3 is newly outputted by a redundancy rescue section, a rescue determination section 5 determines whether or not a main memory cell is to be rescued, based on storage information S4 stored in the non-volatile element section 4, and the rescue information S3 which is newly outputted. The non-volatile element section 4 renews the storage information based on a determination result from the rescue determination section 5. Thus, on the assumption that power is turned off each time a voltage condition is changed, the semiconductor memory device 100 is capable of determining whether or not the rescue is to be performed, based on results of testings performed under a plurality of voltage conditions.

15 Claims, 9 Drawing Sheets

SEMICONDUCTOR MEMORY DEVICE

BACKGROUND OF THE INVENTION

1. Field of the Invention

The present invention relates to a semiconductor memory device, and more particularly to a semiconductor memory device having a redundancy rescue function.

2. Description of the Background Art

In recent years, various techniques for rescuing a semiconductor memory device having a faulty memory cell so as to improve a rate at which good quality is obtained have been suggested in accordance with a semiconductor memory device having an increased capacity. As one of the suggested techniques, a technique in which a spare memory cell is previously provided, and a faulty memory cell is replaced with the spare memory cell is suggested. The spare memory is also called a redundant memory, and a semiconductor memory device having the redundant memory is called a semiconductor memory device having a redundancy rescue function.

Whether or not the main memory cells other than the spare memory cells include a faulty memory cell is determined through testing using a tester. Whether or not a faulty memory cell is included depends on a voltage condition. Therefore, in the testing using a tester, whether or not the fault memory cell is included is determined by changing voltage conditions.

In the testing using a tester, when a voltage condition is changed, an influence of surge and the like may cause an erroneous measurement. Therefore, in general, power is turned off each time a voltage condition is changed. A result of testing under a stable voltage condition can be obtained when testing is performed by turning off power each time a voltage condition is changed. These conventional arts are disclosed in, for example, Japanese Laid-Open Patent Publication No. 2003-36696 and Japanese Laid-Open Patent Publication No. 11-16390.

In a case where the testing is performed by turning off power each time a voltage condition is changed, the result of the testing under the voltage condition which is obtained before power is turned off may be erased unless the result of the testing is stored in an external tester device.

In recent years, a self repair function called a BISR (Built-In Self Repair) is incorporated in a semiconductor memory device in many cases. The semiconductor memory device having the self repair function incorporated therein detects for a faulty memory cell therein without using an external tester device. However, when a conventional semiconductor memory device having the self repair function incorporated therein is powered off each time a voltage condition is changed, so as to perform the testing, the result of the testing which is obtained before power is turned off is erased because an external tester device is not used. Therefore, on the assumption that, in the conventional art, the semiconductor memory device having the self repair function incorporated therein is to perform the testing by turning off power each time a voltage condition is changed, it is impossible to determine, by using the results of the testings under all the voltage conditions, whether or not the rescue is to be performed.

SUMMARY OF THE INVENTION

Therefore, an object of the present invention is to provide a semiconductor memory device capable of determining whether or not rescue is to be performed, based on the results of the testings under a plurality of voltage conditions, on the assumption that power is turned off each time a voltage condition is changed.

The present invention has the following features to attain the object mentioned above. A first aspect of the present invention is directed to a semiconductor memory device comprising: a redundancy rescue function memory including a main memory cell and a spare memory cell for rescuing the main memory cell, in which, when the main memory cell is a faulty memory cell, the faulty memory cell is replaced with the spare memory cell so as to rescue the main memory cell; a test section operable to test the main memory cell; a redundancy rescue section operable to output rescue information associated with rescue of the main memory cell, in accordance with a test result from the test section; a non-volatile element section operable to store information necessary for rescuing the main memory cell, as storage information, in a non-volatile element; and a rescue determination section operable to determine, when the rescue information is newly outputted by the redundancy rescue section, whether or not the main memory cell is to be rescued, based on the storage information stored in the non-volatile element section, and the rescue information which is newly outputted, and, in the semiconductor memory device, the non-volatile element section renews the storage information based on a determination result from the rescue determination section.

In a second aspect of the present invention, the non-volatile element section further includes a volatile element operable to store the rescue information outputted by the redundancy rescue section, and the non-volatile element section stores, based on a determination result from the rescue determination section, the rescue information stored in the volatile element, as the storage information, in the non-volatile element.

In a third aspect of the present invention, the non-volatile element is an electrical fuse element.

In a fourth aspect of the present invention, the rescue information outputted by the redundancy rescue section includes at least, rescue address information associated with an address of the faulty memory cell which is to be replaced with the spare memory cell, and a redundancy enable signal indicating whether or not rescue is possible.

In a fifth aspect of the present invention, the rescue determination section determines whether or not the main memory cell is to be rescued, based on the redundancy enable signal included in the rescue information which is newly outputted, and the redundancy enable signal included in the storage information.

In a sixth aspect of the present invention, the non-volatile element section further includes a first volatile element operable to store the storage information stored in the non-volatile element, and the redundancy rescue section outputs the rescue information in series in synchronization with a predetermined clock, and the non-volatile element section outputs, in series, the storage information stored in the first volatile element while storing, in the first volatile element, the rescue information outputted by the redundancy rescue section in synchronization with the predetermined clock, and the rescue determination section includes: a second volatile element operable to store, in synchronization with the predetermined clock, the rescue information outputted by the redundancy rescue section; a third volatile element operable to store the storage information outputted by the non-volatile element section; a comparison circuit operable to compare the rescue information stored in the second volatile element, with the storage information stored in the third volatile element; and a rescue determination output section operable to determine whether or not the main memory cell is to be rescued, based on a comparison result from the comparison circuit, and output a determination result.

In a seventh aspect of the present invention, the non-volatile element section transfers, in series, the storage information stored in the first volatile element to the third volatile element in a first-in first-out order.

In an eighth aspect of the present invention, the comparison circuit compares the redundancy enable signal which is included in the rescue information stored in the second volatile element, with the redundancy enable signal which is included in the storage information stored in the third volatile element.

In a ninth aspect of the present invention, the rescue information outputted by the redundancy rescue section includes at least one of rescue address information associated with an address of the faulty memory cell which is to be replaced with the spare memory cell, and redundancy enable signal indicating whether or not rescue is possible, and, in the semiconductor memory device, the redundancy rescue section outputs, in series, the rescue information including the rescue address information and the redundancy enable signal, and outputs, in parallel, the rescue information including the redundancy enable signal, and the rescue determination section determines whether or not the main memory cell is to be rescued, based on the rescue information which is outputted by the redundancy rescue section in parallel, and the redundancy enable signal included in the storage information.

In a tenth aspect of the present invention, the non-volatile element section further includes a first volatile element operable to store the rescue information which is outputted by the redundancy rescue section in series, and a second volatile element operable to store the redundancy enable signal which is included in the storage information stored in the non-volatile element, and the rescue determination section includes: a third volatile element operable to store the rescue information which is outputted by the redundancy rescue section in parallel; a fourth volatile element operable to store the redundancy enable signal stored in the second volatile element; a comparison circuit operable to compare the redundancy enable signal which is included in the rescue information and stored in the third volatile element, with the redundancy enable signal stored in the fourth volatile element; and a rescue determination output circuit operable to determine whether or not the main memory cell is to be rescued, based on a comparison result from the comparison circuit, and output a determination result.

In an eleventh aspect of the present invention, the redundancy enable signal stored in the second volatile element is transferred to the fourth volatile element.

In a twelfth aspect of the present invention, the redundancy enable signal stored in the second volatile element is transferred to the fourth volatile element in a first-in last-out order.

In a thirteenth aspect of the present invention, the redundancy rescue section outputs a rescue possibility determination signal indicating whether or not the main memory cell can be rescued, and the semiconductor memory device further comprises a final determination section operable to determine that the main memory cell 1s not to be rescued, regardless of a determination result from the rescue determination section, when the rescue possibility determination signal indicating that rescue is impossible is outputted by the redundancy rescue section.

In a fourteenth aspect of the present invention, the first volatile element, the second volatile element, and the third volatile element have a same number of storage elements.

A fifteenth aspect of the present invention is directed to a semiconductor memory device comprising; test units each including a redundancy rescue function memory including a main memory cell and a spare memory cell for rescuing the main memory cell, in which, when the main memory cell is a faulty memory cell, the faulty memory cell is replaced with the spare memory cell so as to rescue the main memory cell; a chip level rescue possibility determination section operable to determine whether or not the semiconductor memory device as a whole is to be rescued, based on a rescue possibility determination signal indicating whether or not the main memory cell can be rescued, the rescue possibility determination signal being outputted by each of the test units, and, in the semiconductor memory device, each of the test units further includes: a test section operable to test the main memory cell; a redundancy rescue section operable to output rescue information associated with rescue of the main memory cell, in accordance with a test result from the test section; anon-volatile element section operable to store information necessary for rescuing the main memory cell, as storage information, in a non-volatile element; and a rescue determination section operable to determine, when the rescue information is newly outputted by the redundancy rescue section, whether or not the main memory cell is to be rescued, based on the storage information stored in the non-volatile element section, and the rescue information which is newly outputted, and, in the semiconductor memory device, the non-volatile element section renews the storage information based on a determination result from the rescue determination section, and the chip level rescue possibility determination section determines that the semiconductor memory device as a whole is not to be rescued, when at least one of the test units outputs the rescue possibility determination signal indicating that rescue is impossible.

According to the first aspect of the present invention, information necessary for rescuing the main memory cell is stored as the storage information in the non-volatile element. Therefore, even in a case where power is turned off each time a voltage condition is changed, the information enabling the main memory cell to be rescued under a voltage condition obtained before power is turned off is held in the semiconductor memory device. When the rescue information is obtained under a new voltage condition, the semiconductor memory device determines whether or not rescue is to be performed, based on the storage information stored in the non-volatile element, and the rescue information obtained under a new voltage condition, and renews the storage information. Accordingly, provided is a semiconductor memory device capable of determining whether or not information enabling the main memory cell to be rescued under all the voltage conditions can be obtained, even in a case where the testing is performed under a plurality of voltage conditions on the assumption that power is turned off each time a voltage condition is changed.

According to the second aspect of the present invention, the rescue information is temporarily stored in the volatile element, and the rescue information is stored as the storage information in the non-volatile element depending on the determination result. Therefore, the semiconductor memory device is capable of easily storing, in the non-volatile element, the rescue information obtained under a new voltage condition, based on the determination result.

According to the third aspect of the present invention, it is possible to easily configure the non-volatile element. Further, it is possible to determine whether or not the rescue is to be performed, based on disconnection states of all the electrical fuse elements in the electrical fuse circuit, and the rescue information obtained under a new voltage condition.

According to the fourth aspect of the present invention, the rescue information includes the redundancy enable signal, and therefore the rescue determination section is capable of easily determining whether or not the main memory cell is to be rescued, by using the redundancy enable signal.

According to the fifth aspect of the present invention, whether or not the rescue is to be performed is determined by using only the redundancy enable signal, thereby simplifying the rescue determination section.

According to the sixth aspect of the present invention, the storage information is transferred to the rescue determination section, and the storage information is compared with the rescue information obtained under a new voltage condition, and the rescue determination section is able to determine whether or not the rescue is to be performed. Further, the rescue information and the storage information are transferred in series, thereby simplifying the configuration of each of the redundancy rescue section, the non-volatile element section, and the rescue determination section.

According to the seventh aspect of the present invention, the storage information is transferred from the non-volatile element section to the rescue determination section in a first-in first-out order. Therefore, a clock for transfer may be also used as a clock by which the redundancy rescue section outputs the rescue information. The same clock is used for the storage information and the rescue information, thereby enabling the storage information and the rescue information to be easily transferred.

According to the eighth aspect of the present invention, whether or not the rescue is to be performed is determined by using only the redundancy enable signal, thereby making the comparison circuit compact.

According to the ninth aspect of the present invention, the rescue information is transferred to the rescue determination section in parallel. Therefore, the number of times a clock for transfer is generated can be reduced, thereby shortening a time period for the transfer. As a result, it is possible to shorten a time period for testing.

According to the tenth to the twelfth aspects of the present invention, only the redundancy enable signal, included in the storage information based on the voltage condition obtained before power is turned off, is transferred to the rescue determination section, and the rescue determination section simply performs comparison between the redundancy enable signals. Therefore, the time period for transfer is shortened, and the number of circuits of the volatile element can be reduced. As a result, the time period for testing is shortened, and a circuit scale of the semiconductor memory device can be reduced.

According to the thirteenth aspect of the present invention, when the redundancy rescue function memory includes a plurality of memory units, and the plurality of memory units includes a faulty memory unit which cannot be rescued, the rescue for the memory units other than the faulty memory unit is not performed. Therefore, efficiency for testing the plurality of memory units is enhanced because the meaningless rescue for the memory units other than the faulty memory unit is stopped.

According to the fourteenth aspect of the present invention, the memory units each include the same number of components therein even when the memory units have memory structures different from each other. Therefore, the number of times a clock necessary for transferring the rescue information is generated can be easily set. Therefore, it is possible to minimize an error caused when the same number of clocks are generated.

According to the fifteenth aspect of the present invention, when a fault which cannot be rescued occurs in a plurality of redundancy rescue function memories included in a chip, the rescue for the redundancy rescue function memories other than the faulty memory is not performed. Therefore, meaningless rescue process for the redundancy rescue function memories other than the faulty memory is stopped, thereby enhancing efficiency for testing the plurality of redundancy rescue function memories.

The semiconductor memory device according to the present invention has industrial applicability because the semiconductor memory device is capable of, for example, determining whether or not the rescue is to be performed, under a plurality of voltage conditions, when power is turned off.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
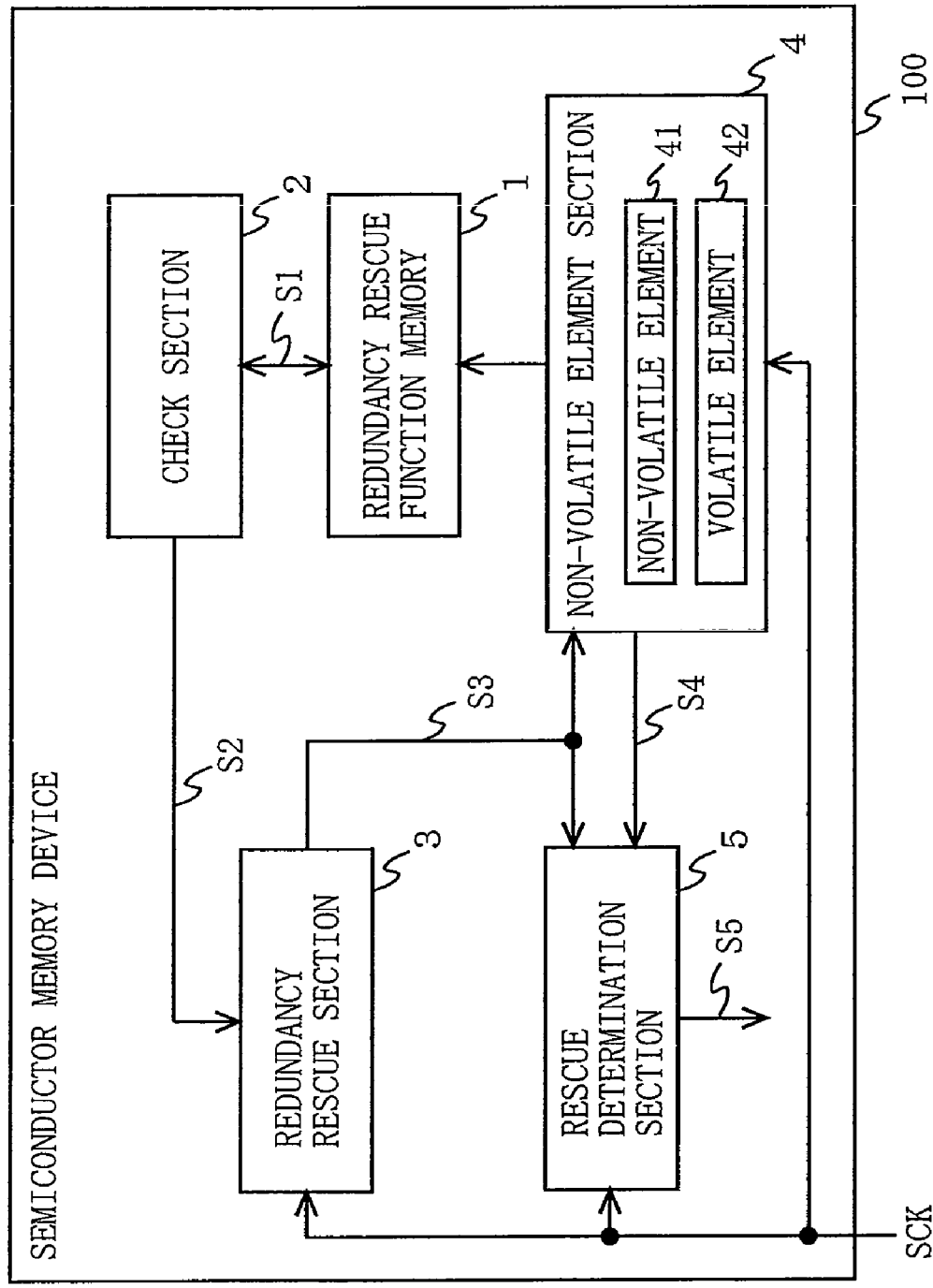
FIG. 1 is a block diagram illustrating a functional configuration of a semiconductor memory device 100 according to a first embodiment of the present invention.

FIG. 1 is a block diagram illustrating a functional configuration of a semiconductor memory device 100 according to a first embodiment of the present invention. As shown in FIG. 1, the semiconductor memory device 100 includes a redundancy rescue function memory 1, a test section 2, a redundancy rescue section 3, a non-volatile element section 4, and a rescue determination section 5. A rescue information transfer clock SCK is inputted to the semiconductor memory device 100 from the outside.

The redundancy rescue function memory 1 includes main memory cells (not shown) and spare memory cells (not shown). The spare memory cell is a memory cell with which a faulty memory cell included in the main memory cells is replaced. The faulty memory cells are replaced with the spare memory cells so as to rescue the main memory cells. A configuration of the redundancy rescue function memory 1 is not limited to any specific one. In the present invention, any known redundancy rescue function memory may be used.

Each time a voltage condition for testing is changed, the test section 2 inputs, to the redundancy rescue function memory 1, test signals S1 for testing the main memory cells, and outputs test result information S2 indicating a result of the testing in accordance with a response from the redundancy rescue function memory 1. For example, the test section 2 supplies an SRAM test pattern to the redundancy rescue function memory 1 and performs a desired testing, by using the test signals S1 including a test clock signal, an address signal, an input/output data line, a control line, and the like, and outputs the test result information S2. The method for testing the main memory cells is not limited to any specific one, and any known method for testing may be used in the present invention.

The redundancy rescue section 3 determines whether the result of the testing indicates "pass" or "fail", based on the test result information S2 from the test section 2. The redundancy rescue section 3 determines whether or not the main memory cell can be rescued when the result of the testing indicates "fail". When the rescue is possible, the redundancy rescue section 3 outputs rescue information S3 relating to the rescue of the main memory cell. The rescue information S3 outputted by the redundancy rescue section 3 is information used for rescuing the main memory cell which is tested under a voltage condition under which the test section 2 performs the testing. Therefore, the rescue information S3 may be different for each voltage condition. The rescue information S3 is outputted in synchronization with the rescue information transfer clock SCK. The method in which the redundancy rescue section 3 determines whether or not the main memory cell can be rescued depends on the configuration of the redundancy rescue function memory 1. As described above, the configuration of the redundancy rescue function memory 1 is not limited to any specific one. Therefore, a structure of the rescue information is not limited to any specific one, and any known rescue information may be used in the present invention. The redundancy rescue section 3 may output information indicating whether the result of the testing indicates "pass" or "fail".

The non-volatile element section 4 includes a non-volatile element 41 capable of holding storage contents in the case of power being turned off, and a volatile element 42 having storage contents erased in the case of power being turned off. The rescue information S3 outputted by the redundancy rescue section 3 is inputted to the non-volatile element section 4 in synchronization with the rescue information transfer clock SCK. The non-volatile element section 4 stores, in the volatile element 42, the rescue information S3 inputted from the redundancy rescue section 3. The non-volatile element 41 stores information necessary for rescuing a main memory cell. Hereinafter, information stored in the non-volatile element 41 is referred to as storage information S4. The non-volatile element section 4 outputs the storage information S4 in synchronization with the rescue information transfer clock SCK.

When the rescue information S3 is newly outputted by the redundancy rescue section 3 in synchronization with the clock SCK due to a voltage condition being changed, the rescue determination section 5 determines whether or not the main memory cell is to be rescued, based on the storage information S4 outputted by the non-volatile element section 4, and the rescue information S3 which is newly outputted. The rescue determination section 5 outputs the determination result as rescue determination signal S5. The rescue determination signal S5 outputted by the rescue determination section 5 represents a result of determining whether or not the main memory cell is to be rescued, based on information (storage information) enabling the main memory cell to be rescued under the voltage condition having not been changed, and the rescue information enabling the main memory cell to be rescued under the voltage condition having been changed.

The non-volatile element section 4 stores information necessary for rescuing the main memory cell, as the storage information, in the non-volatile element 41 when the rescue determination signal S5 indicates that the main memory cell is to be rescued. For example, the non-volatile element section 4 stores the rescue information (the rescue information for the changed voltage condition) stored in the volatile element 42, as the storage information, in the non-volatile element 41. Therefore, in a case where the main memory cell can be rescued when a voltage condition is changed, information enabling the main memory cell to be rescued under the changed voltage condition is stored as the storage information in the non-volatile element section 4.

Next, a specific operation, from an initial state, performed by the semiconductor memory device 100 will be described. Firstly, in the initial state, information indicating that the main memory cell need not be rescued is stored, as the storage information, in the non-volatile element 41 of the non-volatile element section 4. When the testing is performed under a first voltage condition, the test section 2 outputs the test result information S2 for the first voltage condition. The redundancy rescue section 3 determines whether or not the main memory cell can be rescued, based on the test result information S2. When the rescue is possible, the redundancy rescue section 3 outputs the rescue information S3. The rescue information S3 is inputted to the rescue determination section 5 and the volatile element 42 of the non-volatile element section 4. At this time, the non-volatile element section 4 inputs, to the rescue determination section 5, the storage information S4 stored in the non-volatile element 41, and stores, in the volatile element 42, the rescue information from the redundancy rescue section 3. Next, the rescue determination section 5 determines whether or not the main memory cell is to be rescued, based on the rescue information S3 from the redundancy rescue section 3 and the storage information S4 from the non-volatile element section 4. The non-volatile element section 4 renews the storage information stored in the non-volatile element 41, based on the rescue information S3 stored in the volatile element 42, in accordance with the determination result from the rescue determination section 5.

Thereafter, the testing is performed under a second voltage condition. In the present invention, power is temporarily turned off when a voltage condition is changed. Therefore, power is turned off before the testing is performed under the second voltage condition, and information other than the storage information stored in the non-volatile element 41 of the non-volatile element section 4 are all erased. When the testing is performed under the second voltage condition, the test section 2 outputs the test result information S2 for the second voltage condition. The redundancy rescue section 3 determines whether nor not the main memory cell can be rescued, based on the test result information S2. When the rescue is possible, the redundancy rescue section 3 outputs the rescue information S3. The rescue information S3 is inputted to the rescue determination section 5 and the volatile element 42 of the non-volatile element section 4. At this time, the non-volatile element section 4 inputs, to the rescue determination section 5, the storage information stored in the non-volatile element 41. Next, the rescue determination section 5 determines whether or not the main memory cell is to be rescued, based on the rescue information S3 from the redundancy rescue section 3 and the storage information S4 from the non-volatile element section 4. The non-volatile element section 4 renews the storage information stored in the non-volatile element 41, based on the rescue information S3 stored in the volatile element 42, in accordance with the determination result from the rescue determination section 5.

As described above, when the testing is performed under all the voltage conditions, and the rescue determination section 5 determines that the main memory cell can be rescued under all the voltage conditions, the storage information enabling the main memory cell to be rescued under all the voltage conditions is stored in the non-volatile element 41 of the non-volatile element section 4. When the testings under all the voltage conditions are completed, and the rescue determination section 5 determines that the main memory cell can be rescued under all the voltage conditions, the semiconductor memory device 100 replaces the faulty memory cell with the spare memory cell, based on the storage information stored in the non-volatile element 41 of the non-volatile element section 4, so as to rescue the main memory cell.

As described above, in these first embodiment, even when power is turned off each time a voltage condition is changed, the rescue information based on the voltage condition obtained before power is turned off is stored as the storage information in a non-volatile element. Therefore, the semiconductor memory device capable of determining whether or not the main memory cell is to be rescued, based on the rescue information obtained for new voltage condition and the rescue information (the storage information) obtained before power is turned off is provided.

In the first embodiment, the rescue information S3 outputted by the redundancy rescue section 3 is stored in the volatile element 42 of the non-volatile element section 4, and the storage information is renewed based on the rescue information stored in the volatile element 42 when the rescue determination section 5 determines that the main memory cell can be rescued. However, the storage information to be stored in the non-volatile element 41 may be information enabling the main memory cell to be rescued, and therefore the volatile element 42 may not necessarily be provided. When the volatile element 42 is not provided, the non-volatile element section 4 may use, for example, the rescue information S3 inputted from the redundancy rescue section 3 to the rescue determination section 5 so as to write the storage information in the non-volatile element 41. Alternatively, the non-volatile element section 4 may store, in the non-volatile element 41, the storage information obtained by an external circuit (not shown), based on the rescue determination signal outputted by the rescue determination section 5.

Second Embodiment

Figure 2:
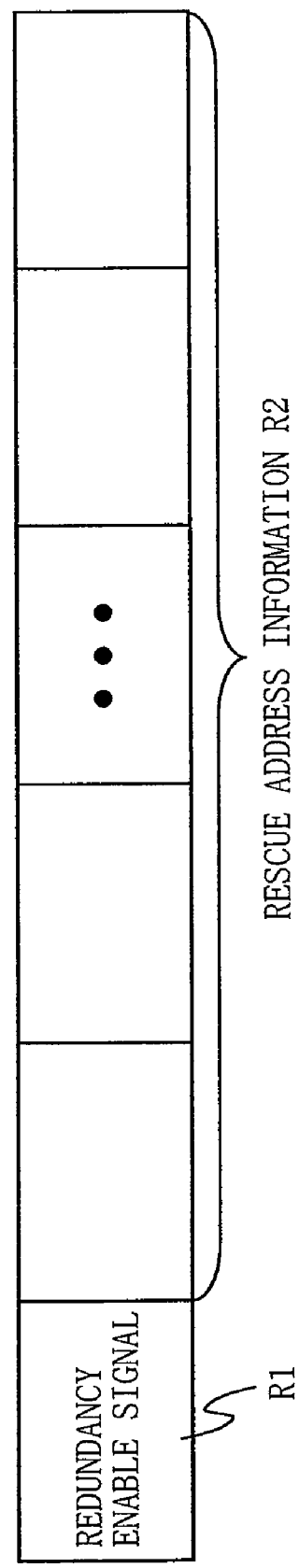
FIG. 2 is a diagram illustrating contents of rescue information used in a semiconductor integrated circuit according to a second embodiment of the present invention.

FIG. 2 is a diagram illustrating contents of the rescue information used in a semiconductor integrated circuit according to a second embodiment of the present invention. A configuration of the semiconductor integrated circuit according to the second embodiment is the same as that of the first embodiment, and the description will be made with reference to FIG. 1.

As shown in FIG. 2, the rescue information includes redundancy enable signal R1 and rescue address information R2. The rescue address information R2 is information associated with an address of a faulty memory cell which is to be replaced with a spare memory cell. The redundancy enable signal R1 is information indicating whether or not the main memory cell can be rescued by using the rescue address information R2.

Hereinafter, differences from the first embodiment will be described. A voltage condition is changed, and the rescue information S3 is newly inputted to the rescue determination section 5 and the volatile element 42 of the non-volatile element section 4. At this time, the non-volatile element section 4 inputs, to the rescue determination section 5, only the redundancy enable signal R1 of the storage information stored in the non-volatile element 41, as the storage information S4. The rescue determination section 5 compares the redundancy enable signal R1 included in the rescue information S3 for the new voltage condition, with the redundancy enable signal R1 included in the storage information S4, determines whether or not the main memory cell can be rescued under the new voltage condition, and outputs the determination result as the rescue determination signal S5. The non-volatile element section 4 renews the storage information based on the determination rescue signal S5.

As described above, in the second embodiment, when reading, from the non-volatile element section 4, the rescue information (the storage information) based on the voltage condition having not been changed, the rescue determination section 5 may read only the redundancy enable signal R1 thereof. Therefore, the rescue information S3 and the storage information S4 which are inputted to the rescue determination section 5 may be restricted, thereby reducing the size of the rescue determination section 5.

Third Embodiment

A configuration of a semiconductor integrated circuit according to a third embodiment is the same as that of the first embodiment. Therefore, description will be made with reference to FIG. 1. Hereinafter, differences from the first embodiment will be described.

When the redundancy rescue section 3 outputs the rescue information S3, the redundancy rescue section 3 outputs the rescue information S3 in series in synchronization with the rescue information transfer clock SCK.

The non-volatile element section 4 receives the rescue information S3 from the redundancy rescue section 3 in series, and stores the rescue information S3 in the volatile element 42. The non-volatile element section 4 outputs the storage information stored in the non-volatile element 41, in series, in synchronization with the rescue information transfer clock SCK, and inputs the storage information to the rescue determination section 5.

The rescue determination section 5 receives the rescue information S3 from the redundancy rescue section 3 and the storage information from the non-volatile element section 4, in series, in synchronization with the rescue information transfer clock SCK.

As described above, the rescue information S3 and the storage information S4 are transferred in series among the relative redundancy rescue section 3, non-volatile element section 4, and rescue determination section 5. Thus, in the third embodiment, each of the redundancy rescue section 3, the non-volatile element section 4, and the rescue determination section 5 can be configured as a circuit of a reduced size.

Fourth Embodiment

Figure 3:
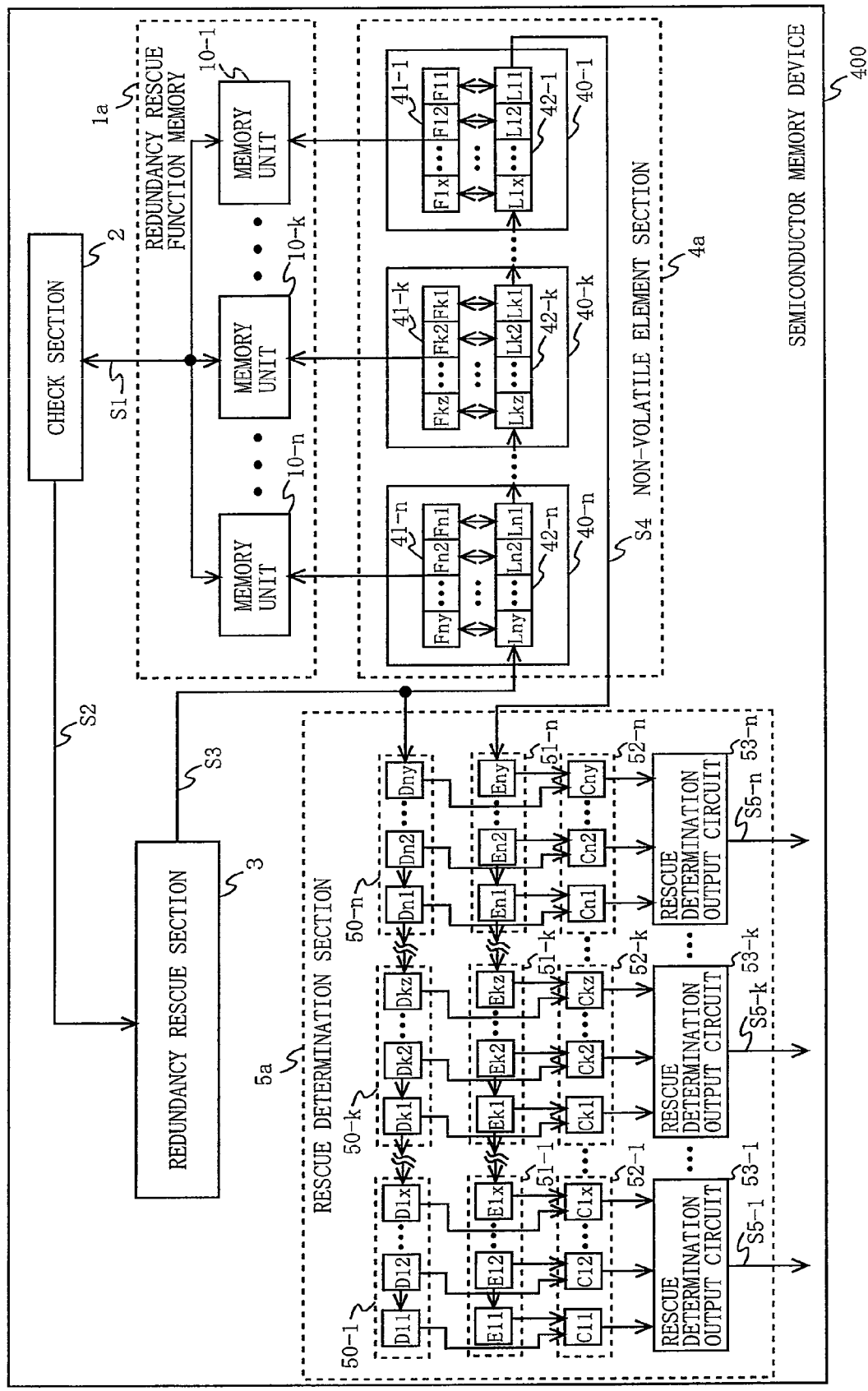
FIG. 3 is a block diagram illustrating a functional configuration of a semiconductor memory device 400 according to a fourth embodiment.

FIG. 3 is a block diagram illustrating a functional configuration of a semiconductor memory device 400 according to a fourth embodiment. In FIG. 3, components having the same functions as the components for the first embodiment are denoted by the same reference numerals as used in the first embodiment, and the description thereof is not given. Further, in the third embodiment, the redundancy rescue function memory 1a includes a plurality of memory units 10-1 to 10-n each having the main memory cells and the spare memory cells. In the third embodiment, the same rescue information as used in the second embodiment is used. Therefore, the description will be made with reference to FIG. 2. The rescue information is generated for each memory unit, so that the size of the rescue information is different depending on the size of the memory unit. In FIG. 3, the rescue information transfer clock SCK, which is not shown, is the same as that used in the first embodiment.

Hereinafter, a configuration of the semiconductor memory device 400 will be described with reference to FIG. 3. As shown in FIG. 3, the semiconductor memory device 400 includes the redundancy rescue function memory 1a, the test section 2, the redundancy rescue section 3, a non-volatile element section 4a, and a rescue determination section 5a.

The redundancy rescue function memory 1a includes the plurality of memory units 10-1 to 10-n each having the main memory cells and the spare memory cells. Here, n is an integer greater than or equal to one. k is an integer ranging from one to n.

The non-volatile element section 4a includes electrical fuse element units 41-1 to 41-n and first latch circuit units 42-1 to 42-n. The electrical fuse element unit 41-k and the first latch circuit unit 42-k forms an electrical fuse circuit unit 40-k. Here, k is an integer ranging from one to n.

The electrical fuse circuit unit 40-k corresponds to the memory unit 10-k wherein k is an integer ranging from one to n. The electrical fuse element unit 41-k includes a redundancy enable signal electrical fuse Fk1 and rescue address information electrical fuses Fk2 to Fkz. Here, z is a positive integer. The number of the rescue address information electric a fuses included in each electrical fuse element unit may be any number. The number of the rescue address information electrical fuses may be the same among the electrical fuse element units, or may be different thereamong. In FIG. 3, the electrical fuse element unit 41-1 can store x pieces of information. On the other hand, the electrical fuse element unit 41-n can store y pieces of information. The redundancy enable signal electrical fuse Fk1 and the rescue address information electrical fuses Fk2 to Fkz are non-volatile elements.

The first latch circuit unit 42-k includes a redundancy enable signal latch circuit Lk1 and rescue address information latch circuits Lk2 to Lkz wherein k is an integer ranging from one to n. The redundancy enable signal latch circuit Lk1 is connected with the rescue address information latch circuits Lk2 to Lkz in series with each other. The number of the rescue address information latch circuits included in each first latch circuit unit may be any number. The number of the rescue address information latch circuits may be the same among the first latch circuit units, or may be different thereamong. However, the number of the rescue address information latch circuits is the same as the number of the rescue address information electrical fuses corresponding thereto. The redundancy enable signal latch circuit Lk1 and the rescue address information latch circuits Lk2 to Lkz are volatile elements.

The electrical fuse element units 41-1 to 41-n store, as the storage information, information necessary for rescuing the memory units 10-1 to 10-n, respectively. The memory unit 10-k is rescued by using the storage information S4 stored in the electrical fuse element 41-k wherein k is an integer ranging from one to n. Each of the first latch circuit units 42-1 to 42-n is capable of storing the rescue information S3 outputted by the redundancy rescue section 3. The first latch circuit unit 42-k stores the rescue information S3 for rescuing the memory unit 10-k wherein k is an integer ranging from one to n. The first latch circuit units 42-1 to 42-n write the rescue information S3 stored therein, as the storage information, in the electrical fuse element units 41-1 to 41-n, respectively, in accordance with the determination result from the rescue determination section 5a. Further, when the testing is started under a new voltage condition, the first latch circuit units 42-1 to 42-n read the storage information S4 stored in the electrical fuse element units 41-1 to 41-n, respectively, and transfer the read storage information S4 to the rescue determination section 5a.

The rescue determination section 5a includes second latch circuit units 50-1 to 50-n, third latch circuit units 51-1 to 51-n, comparison circuit units 52-1 to 52-n, and rescue determination output circuits 53-1 to 53-n.

The second latch circuit unit 50-k includes a redundancy enable signal latch circuit Dk1 and rescue address information latch circuits Dk2 to Dkz wherein k is an integer ranging from one to n. The redundancy enable signal latch circuit Dk1 is connected to the rescue address information latch circuits Dk2 to Dkz in series with each other. The number of the rescue address information latch circuits included in each second latch circuit unit may be any number. The number of the rescue address information latch circuits may be the same among the second latch circuit units, or may be different thereamong. However, the second latch circuit unit 50-k corresponds to the first latch circuit unit 42-k. Therefore, the number of the rescue address information latch circuits included in the second latch circuit unit 50-k is the same as the number of the rescue address information latch circuits included in the first latch circuit unit 42-k. The redundancy enable signal latch circuit Dk1 and the rescue address information latch circuits Dk2 to Dkz are volatile elements. The second latch circuit units 50-1 to 50-n are capable of storing the rescue information S3 outputted by the redundancy rescue section 3. The second latch circuit unit 50-k stores the rescue information S3 for the memory unit 10-k.

The third latch circuit unit 51-k includes a redundancy enable signal latch circuit Ek1 and rescue address information latch circuits Ek2 to Ekz. The redundancy enable signal latch circuit Ek1 is connected to the rescue address information latch circuits Ek2 to Ekz in series with each other. The number of the rescue address information latch circuits included in each third latch circuit unit may be any number. The number of the rescue address information latch circuits may be the same among the third latch circuit units, or may be different thereamong. However, the third latch circuit unit 51-k corresponds to the first latch circuit unit 42-k. Therefore, the number of the rescue address information latch circuits included in the third latch circuit unit 51-k is the same as the number of the rescue address information latch circuits included in the first latch circuit unit 42-k. The redundancy enable signal latch circuit Ek1 and the rescue address information latch circuits Ek2 to Ekz are volatile elements. The third latch circuit units 51-1 to 51-n are capable of storing the storage information S4 transferred by the first latch circuit units 42-1 to 42-n, respectively. The third latch circuit unit 51-k stores the storage information S4 for the memory unit 10-k.

The comparison circuit unit 52-k includes comparison circuits Ck1 to Ckz wherein k is an integer ranging from one to n. The number of the comparison circuits included in each comparison circuit unit may be any number. The number of the comparison circuits may be the same among the comparison circuit units, or may be different thereamong. However, the comparison circuit unit 52-k corresponds to each of the second latch circuit unit 50-k and the third latch circuit unit 51-k. Therefore, the number of the comparison circuits Ck1 to Ckz included in the comparison circuit unit 52-k is the same as the total number of the redundancy enable signal latch circuit Dk1 (or Ek1) and the rescue address information latch circuits Dk2 to Dkz (or Ek2 to Ekz) which are included in the second (or the third) latch circuit unit 50-k (or 51-k). The comparison circuit unit 52-k compares the rescue information S3 stored in the second latch circuit unit 50-k with the storage information S4 stored in the third latch circuit unit 51-k, and outputs the comparison result.

The rescue determination output circuit 53-k corresponds to the comparison circuit unit 52-k wherein k is an integer ranging from one to n. The rescue determination output circuit 53-k determines whether or not the memory unit 10-k is to be rescued, based on the comparison result outputted by the comparison circuit unit 52-k, and outputs the determination result as rescue determination signal S5-k.

Hereinafter, an operation performed by the semiconductor memory device 400 according to the third embodiment will be described with reference to FIG. 3. The semiconductor memory device 400 operates in synchronization with the rescue information transfer clock SCK inputted from the outside. In FIG. 3, the input path of the rescue information transfer clock SCK is not shown. However, the operation performed by the semiconductor memory device 400 will become apparent from the following description.

In an initial state, the electrical fuse elements F11 to F1x, . . . , Fn1 to Fny each have a predetermined digital value. For example, in the initial state, the electrical fuse elements F11 to F1x, . . . , Fn1 to Fny each have a digital value "0" representing non-disconnection state. In this case, a digital value representing disconnection state is "1".

Initially, when the testing is started under a first voltage condition, the rescue information transfer clock SCK indicating the start of the testing is inputted to the non-volatile element section 4a. In response thereto, the non-volatile element section 4a transfers the storage information S4 stored in the electrical fuse element units 41-1 to 41-n, to the first latch circuit units 42-1 to 42-n, respectively. In addition, the test section 2 inputs the test signals S1 to the redundancy rescue function memory 1a, and outputs the test result information S2. The redundancy rescue section 3 generates the rescue information S3 for each of the memory units 10-1 to 10-n, based on the test result information S2 outputted by the test section 2.

Next, the rescue information transfer clock indicating the output of the rescue information S3 is inputted to the redundancy rescue section 3. In response thereto, the redundancy rescue section 3 sequentially outputs, in series, the rescue information S3 for rescuing the memory units 10-1 to 10-n, in synchronization with the rescue information transfer clock.

The rescue information S3 which are outputted in series by the redundancy rescue section 3 are initially stored in a latch circuit Dny of the second latch circuit unit 50-n. In accordance with the immediately following rescue information transfer clock SCK, the information stored in the latch circuit Dny is stored in a latch circuit Dn(y−1), and the information which is newly inputted is stored in the latch circuit Dny. Thus, the rescue information S3 which are outputted in series by the redundancy rescue section 3 are stored in the order starting from the second latch circuit unit 50-n, and the rescue information S3 are finally stored in the second latch circuit units 50-1 to 50-n in the order in which the rescue information S3 are outputted in series.

After the rescue information S3 are stored in the second latch circuit units 50-1 to 50-n, the rescue information S3 which are outputted in series by the redundancy rescue section 3 are stored in the first latch circuit units 42-1 to 42-n in the order in which the rescue information S3 are outputted in series. At this time, the storage information S4 stored in the first latch circuit units 42-1 to 42-n are outputted in series so as to be stored in the third latch circuit units in the order starting from the third latch circuit unit 51-n. Thus, the storage information S4 for the memory units 10-1 to 10-n are stored in the third latch circuit units 51-1 to 51-n, respectively. As described above, while the non-volatile element section 4a stores the rescue information in the first latch circuit units 42-1 to 42-n, the storage information are outputted in series in the first-in first-out order.

In accordance with the rescue information transfer clock SCK which is generated at a time when the rescue information S3 are stored in the second latch circuit units 50-1 to 50-n, and the storage information S4 are stored in the third latch circuit units 51-1 to 51-n, the comparison circuit units 52-1 to 52-n read the rescue information S3 from the second latch circuit units 50-1 to 50-n, respectively, and read the storage information S4 from the third latch circuit units 51-1 to 51-n, respectively. The comparison circuit units 52-1 to 52-n each compare the rescue information S3 with the storage information S4, and output the comparison result.

The rescue determination output circuits 53-1 to 53-n determine whether or not the memory units 10-1 to 10-n are to be rescued, based on the inputted comparison results, respectively. The determination criterion used by each of the rescue determination output circuits 53-1 to 53-n is not limited to any specific one.

For example, a case where all the storage information S4 for the memory unit 10-k represents "0" will be described. In this case, the rescue determination output circuit 53-k determines that the memory unit 10-k is to be rescued when the rescue information S3 for the memory unit 10-k includes at least one "1". On the other hand, in a case where none of the storage information S4 for the memory unit 10-k represents "0", the rescue determination output circuit 53-k determines that the memory unit 10-k is to be rescued only when the rescue information S3 for the memory unit 10-k is the same as the storage information S4 for the memory unit 10-k. However, when the memory unit 10-k need not be rescued as in the case where all the rescue information S3 represent "0", the rescue determination output circuit 53-k determines that the memory unit 10-k is not rescued. Further, the rescue determination output circuit 53-k outputs, when the redundancy enable signal of the rescue information S3 indicates that the rescue is impossible, the rescue determination signal indicating that the rescue is impossible. When the rescue determination signal indicating that the rescue is impossible is outputted, the semiconductor memory device 400 handles the main memory cell as a faulty memory cell without rescuing the main memory cell.

When the rescue determination signals S5-1 to S5-n outputted by the rescue determination section 5a each indicate that the main memory cell is to be rescued, the non-volatile element section 4a disconnects the electrical fuse element unit 41-k corresponding to the memory unit 10-k to be rescued, based on the rescue information S3 stored in the first latch circuit unit 42-k. Thus, the operation under the first voltage condition is completed.

Next, a voltage condition is changed to a second voltage condition. In the present invention, when a voltage condition is changed, supply of power to the semiconductor memory device 400 is stopped. Therefore, power is turned off before the voltage condition is changed to the second voltage condition, so that information stored in the first to the third latch circuits, each of which is a volatile element, are erased.

When the testing is started under the second voltage condition, the rescue information transfer clock SCK indicating the start of the testing is inputted to the non-volatile element section 4a. In response thereto, the non-volatile element section 4a transfers the storage information S4 stored in the electrical fuse element units 41-1 to 41-n, to the first latch circuit units 42-1 to 42-n, respectively. Hereinafter, in the same manner as described for the first voltage condition, the rescue information S3 obtained under the second voltage condition is stored in the first and the second latch circuits, and the storage information S4 obtained under the first voltage condition is stored in the third latch circuit.

Thereafter, the comparison circuit units 52-1 to 52-n each compare the rescue information S3 obtained under the second voltage condition, with the storage information S4 obtained under the first voltage condition, in synchronization with a predetermined rescue information transfer clock SCK, and output the comparison result.

The rescue determination output circuits 53-1 to 53-n determine whether or not the memory units 10-1 to 10-n are to be rescued, based on the comparison results, respectively. The determination criterion used by each of the rescue determination output circuits 53-1 to 53-n is not limited to any specific one.

As described above, information (the storage information) enabling the main memory cell to be rescued under the first voltage condition is compared with information (the rescue information) enabling the main memory cell to be rescued under the second voltage condition. When the rescue information enabling the main memory cell to be rescued under both the first and the second voltage conditions are obtained under the second voltage condition, the non-volatile element section 4a disconnects the electrical fuse elements 41-1 to 41-n, based on the rescue information stored in the first latch circuit units 42-1 to 42-n, respectively. Thus, information enabling the main memory cell to be rescued under both the first and the second voltage conditions are stored as the storage information in the electrical fuse elements 41-1 to 41-n, which are non-volatile elements.

A typical example will be described. When the memory unit 10-k is of good quality under the first voltage condition, and the memory unit 10-k need not be rescued, the electrical fuse element unit 41-k for the memory unit 10-k is not disconnected and is in an initial state. A case where, in this state, the memory unit 10-k is faulty under the second voltage condition will be described. In this case, when the rescue information S3 obtained under the second voltage condition is written in the electrical fuse element 41-k, the memory unit 10-k can be rescued under both the first and the second voltage conditions. Therefore, the non-volatile element section 4a writes the rescue information S3 as the storage information in the electrical fuse element unit 41-k.

When the memory unit 10-k is faulty under the first voltage condition, the rescue information S3 obtained under the first voltage condition is stored as the storage information S4 in the electrical fuse element 41-k. When the memory unit 10-k is of good quality under the second voltage condition, the non-volatile element section 4a is able to rescue the memory unit 10-k under both the first and the second voltage conditions without changing the storage information stored in the electrical fuse element 41-k.

When the memory unit 10-k is faulty under the first voltage condition, the rescue information S3 obtained under the first voltage condition is stored as the storage information S4 in the electrical fuse element 41-k. A case where the memory unit 10-k is also faulty under the second voltage condition will be described. When the rescue information S3 and the storage information S4 for the memory unit 10-k is the same under the second voltage condition, it is possible to rescue the memory unit 10-k under both the first and the second voltage conditions without changing the storage information stored in the electrical fuse element 41-k. On the other hand, when the rescue information S3 and the storage information S4 for the memory unit 10-k are not the same under the second voltage condition, and the electrical fuse element unit 41-k is disconnected based on the rescue information S3 obtained under the second voltage condition, the storage information stored in the electrical fuse element unit 41-k may not enable the memory unit 10-k to be rescued under both the first and the second voltage conditions. Therefore, the results of the comparisons between the rescue information S3 and the storage information S4 are previously classified, and the rescue determination output circuits 5-1 to 5-n may write the rescue information S3 which is newly obtained, in the electrical fuse circuit, so as to determine whether or not the rescue is possible. Alternatively, each of the rescue determination output circuits 5-1 to 5-n may output the rescue determination signal indicating that the rescue is impossible, when the result of the comparison between the rescue information S3 and the storage information S4 indicates that the rescue information S3 is different from the storage information S4. When the rescue determination signal indicating that the rescue is impossible is outputted, the semiconductor memory device 400 is determined as being faulty, and the process under the subsequent voltage conditions may be stopped.

After the testing under the second voltage condition is completed, power is turned off, and the testing under the third voltage condition is started. The subsequent operations are performed in the same manner as described for the first and the second voltage conditions.

As described above, in the fourth embodiment, information enabling the main memory cell to be rescued under the previous voltage conditions are stored as the storage information in the electrical fuse circuit unit which is a non-volatile element. Thus, even when power is turned off so as to change a voltage condition, the storage information obtained under the previous voltage conditions remain stored. When the testing is performed under a new voltage condition, the rescue information under the new voltage condition is compared with the storage information under the previous voltage condition, and whether or not the main memory cell is to be rescued is determined based on the comparison result, and, as necessary, the electrical fuse circuit is disconnected. Thus, information which enables the main memory cell to be rescued under a previous voltage condition, and also enables the main memory cell to be rescued under a new voltage condition is stored as the storage information in the electrical fuse circuit unit which is a non-volatile element. Therefore, even when power is turned off so as to change a voltage condition to another one, the information enabling the main memory cell to be rescued under the voltage conditions preceding the another voltage condition remains stored. Thus, when the testings under all the voltage conditions are completed without determining halfway that all the main memory cells are faulty, the non-volatile element section 4 has stored, as the storage information, the information enabling the main memory cell to be rescued under all the voltage conditions. As a result, the semiconductor memory device replaces, by using the storage information, a faulty memory cell included in the main memory cells, with the spare memory cell, so as to rescue the main memory cell, thereby providing a main memory cell of good quality.

Further, in the fourth embodiment, by using a common rescue information transfer clock, the input and output of the rescue information are made among the redundancy rescue section 3, the non-volatile element section 4a, and the rescue determination section 5a, and the input and output of the storage information is made between the non-volatile element section 4a and the rescue determination section 5a. Therefore, the comparison between the rescue information and the storage information can be accurately made. A clock, other than the rescue information transfer clock, having the same frequency as the rescue information transfer clock may be inputted to the redundancy rescue section 3, the non-volatile element section 4a, and the rescue determination section 5a such that the rescue information and the storage information are inputted and outputted in accordance with the clock.

Fifth Embodiment

Figure 4:
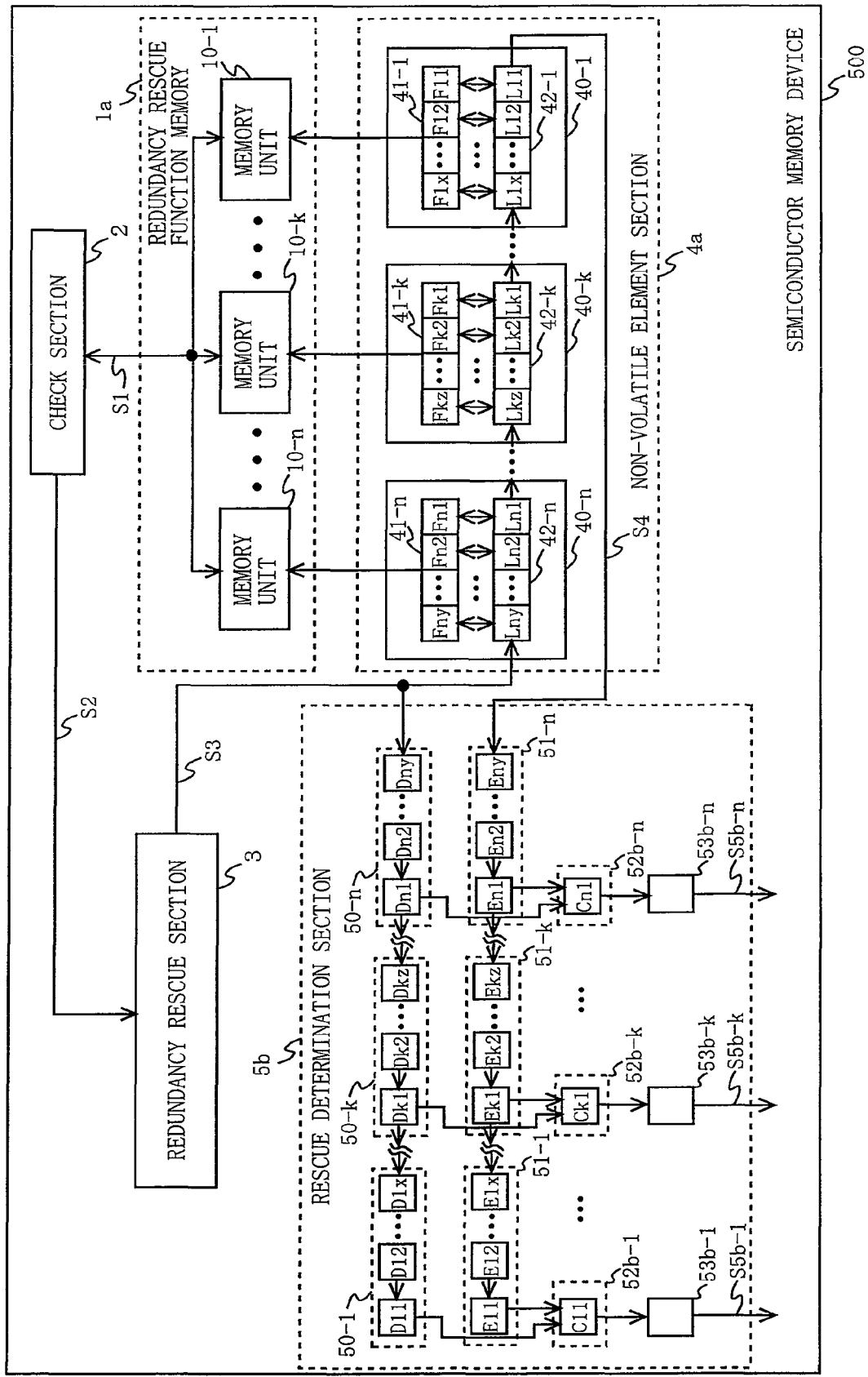
FIG. 4 is a block diagram illustrating a functional configuration of a semiconductor memory device 500 according to a fifth embodiment of the present invention.

FIG. 4 is a block diagram illustrating a functional configuration of a semiconductor memory device 500 according to a fifth embodiment of the present invention. In FIG. 4, the same components as described in the fourth embodiment are denoted by the same reference numerals as used in the fourth embodiment, and the description thereof is not given. In the fifth embodiment, the same rescue information as used in the second embodiment is used. Therefore, the description will be made with reference to FIG. 2.

As shown in FIG. 4, the semiconductor memory device 500 includes the redundancy rescue function memory 1a, the test section 2, the redundancy rescue section 3, the non-volatile element section 4a, and a rescue determination section 5b.

The rescue determination section 5b includes the second latch circuit units 50-1 to 50-n, the third latch circuit units 51-1 to 51-n, comparison circuit units 52b-1 to 52b-n, and rescue determination output circuits 53b-1 to 53b-n.

A main component of the comparison circuit unit 52b-k is the comparison circuit Ck1 only wherein k is an integer ranging from one to n. A redundancy enable signal included in the rescue information S3 which is obtained under a new voltage condition, and is stored in the redundancy enable signal latch circuit Dk1 of the second latch circuit unit 50-k, is compared with the redundancy enable signal included in the storage information S4 which is obtained under the previous voltage condition, and is stored in the redundancy enable signal latch circuit Ek1 of the third latch circuit unit 51-k, and a comparison result is outputted.

The rescue determination output circuit 53b-k determines whether or not the memory unit 10-k is to be rescued, based on the result of the comparison between the redundancy enable signals wherein k is an integer ranging from one to n. For example, when the redundancy enable signal of the storage information S4 represents "1", the electrical fuse is disconnected, whereas when the redundancy enable signal of the storage information S4 represents "0", the electrical fuse is not disconnected. Further, when the redundancy enable signal of the rescue information represents "1", the rescue is possible, whereas when the redundancy enable signal of the rescue information represents "0", the rescue is impossible. In this case, only when the redundancy enable signal latch circuit Ek1 represents "0", and the redundancy enable signal latch circuit Dk1 represents "1", the rescue determination output circuit 53b-k may output the rescue determination signal S5b-k indicating that the memory unit 10-k is to be rescued. The determination criterion used by each of the rescue determination output circuits 53b-1 to 53b-n is not limited thereto.

As described above, in the fifth embodiment, only the redundancy enable signals are used for determining whether or not the main memory cell is to be rescued. Therefore, the comparison circuit unit may be compact, thereby reducing the size of the semiconductor memory device.

Sixth Embodiment

Figure 5:
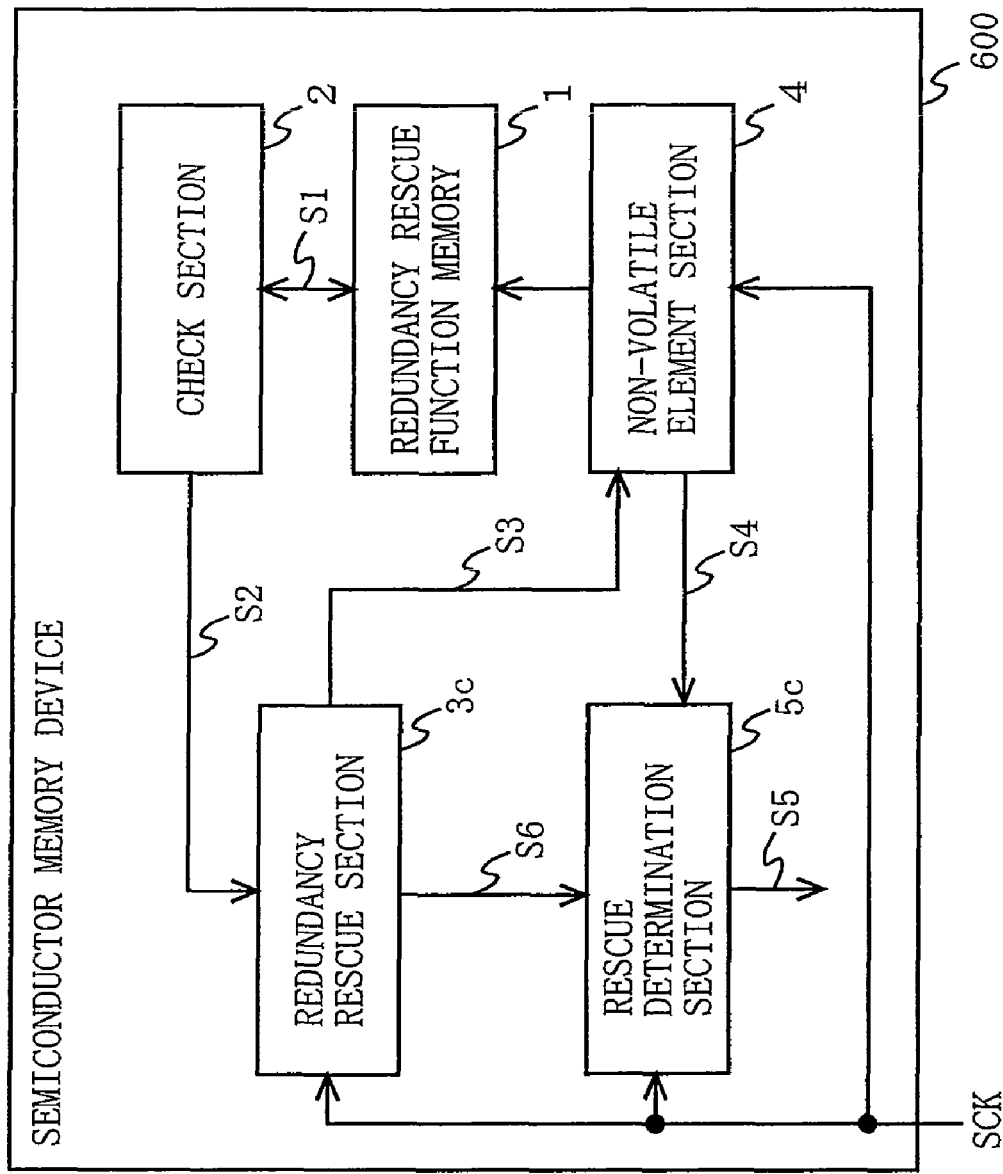
FIG. 5 is a block diagram illustrating a functional configuration of a semiconductor memory device 600 according to a sixth embodiment of the present invention.

FIG. 5 is a block diagram illustrating a functional configuration of a semiconductor memory device 600 according to a sixth embodiment of the present invention. In the sixth embodiment, components having the same functions as the components for the first embodiment are denoted by the same reference numerals as used in the first embodiment, and the description thereof is not given.

As shown in FIG. 5, the semiconductor memory device 600 includes the redundancy rescue function memory 1, the test section 2, a redundancy rescue section 3c, the non-volatile element section 4, and a rescue determination section 5c.

The redundancy rescue section 3c outputs the rescue information in parallel with each other. The rescue information outputted by the redundancy rescue section 3c in parallel with each other is referred to as rescue information S6.

The rescue determination section 5c determines whether or not the main memory cell is to be rescued, based on the rescue information S6 outputted by the redundancy rescue section 3c in parallel with each other, and the storage information S4 outputted by the non-volatile element section 4.

An exemplary specific configuration of the rescue determination section 5c according to the sixth embodiment may be a configuration in which the rescue information S6 outputted by the redundancy rescue section 3c in parallel with each other are stored in the second latch circuit units 50-1 to 50-n of the rescue determination section 5a shown in FIG. 3.

As described above, in the sixth embodiment, the rescue information S6 are outputted by the redundancy rescue section 3c in parallel with other, and therefore the number of times the rescue information transfer clock is generated for transferring the rescue information to the rescue determination section 5c can be reduced, thereby shortening a time period for transfer.

Seventh Embodiment

Figure 6:
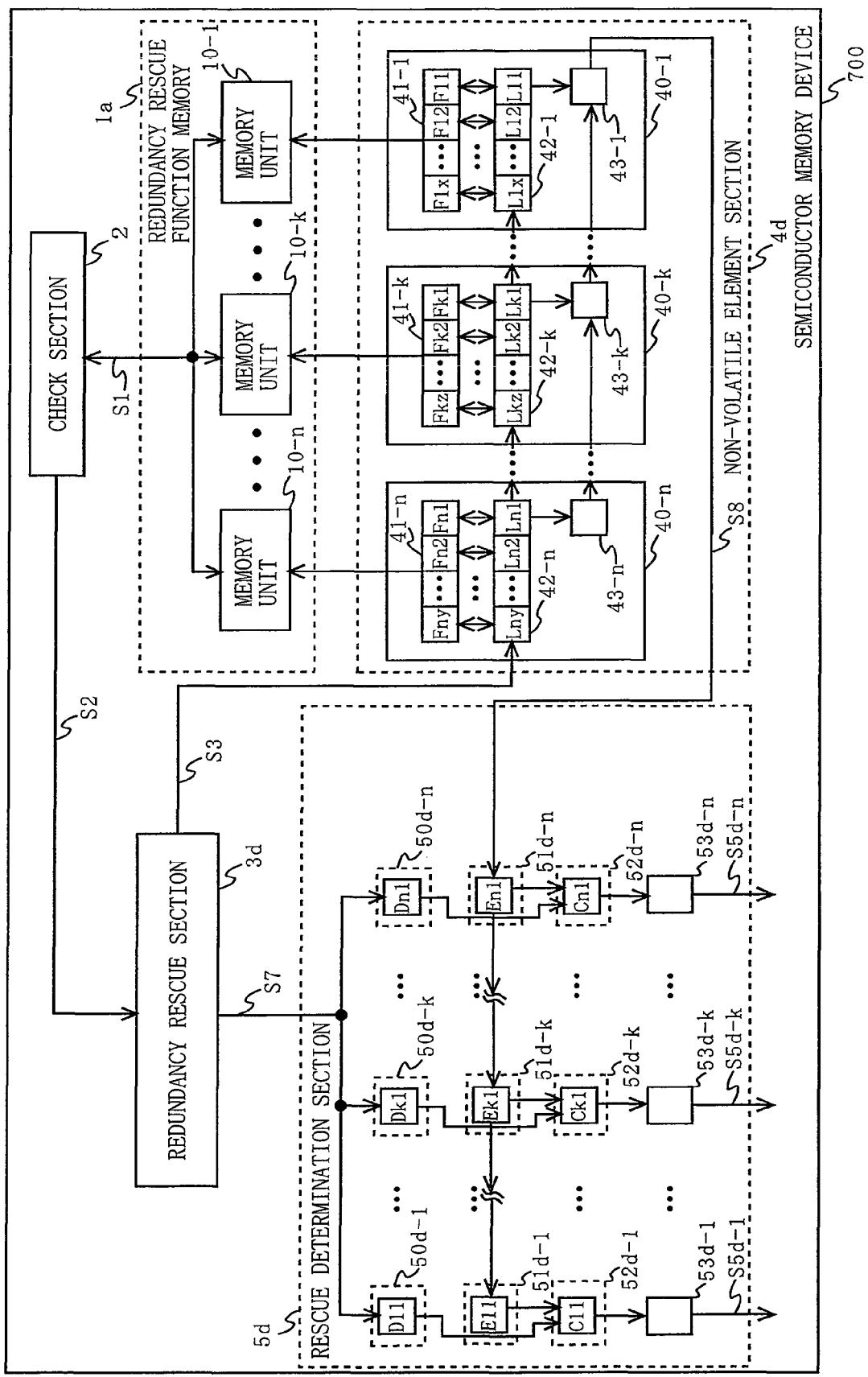
FIG. 6 is a block diagram illustrating a functional configuration of a semiconductor memory device 700 according to a seventh embodiment of the present invention.

FIG. 6 is a block diagram illustrating a functional configuration of a semiconductor memory device 700 according to a seventh embodiment of the present invention. In FIG. 6, components having the same functions as the components for the first and the fourth embodiments are denoted by the same reference numerals as used in the first and the fourth embodiments, and the description thereof is not given.

In FIG. 6, the semiconductor memory device 700 includes the redundancy rescue function memory 1a, the test section 2, a redundancy rescue section 3d, the non-volatile element section 4a, and a rescue determination section 5d.

In synchronization with the rescue information transfer clock SCK, the redundancy rescue section 3d outputs the rescue information S3 in series with each other, and outputs the redundancy enable signal included in the rescue information S3, as rescue information S7, in parallel with each other.

The non-volatile element section 4d includes the electrical fuse element units 41-1 to 41-n, the first latch circuit units 42-1 to 42-n, and redundancy enable signal transfer latch circuits 43-1 to 43-n. The redundancy enable signal transfer latch circuits 43-1 to 43-n store the redundancy enable signals included in the storage information which are stored in the first latch circuit units 42-1 to 42-n, respectively. The redundancy enable signals stored in the redundancy enable signal transfer latch circuits 43-1 to 43-n are transferred, as storage information S8, to the rescue determination section 5d in series. The redundancy enable signal transfer latch circuits 43-1 to 43-n are volatile elements.

The rescue determination section 5d includes second latch circuit units 50d-1 to 50d-n, third latch circuit units 51d-1 to 51d-n, comparison circuit units 52d-1 to 52d-n, and rescue determination output circuits 53d-1 to 53d-n.

The second latch circuit units 50d-1 to 50d-n have redundancy enable signal latch circuits D11 to Dn1, respectively. The redundancy enable signal latch circuits D11 to Dn1 store the rescue information S7 which are outputted by the redundancy rescue section 3d in parallel with each other.

The third latch circuit units 51d-1 to 51d-n have redundancy enable signal latch circuits E11 to En1, respectively. The redundancy enable signal latch circuits E11 to En1 are connected in series with each other. The redundancy enable signal latch circuits E11 to En1 store the storage information S8 which are outputted by the non-volatile element section 4d in series.

The comparison circuit units 52d-1 to 52d-n include the comparison circuits C11 to Cn1, respectively. The comparison circuit Ck1 compares the redundancy enable signal stored in the redundancy enable signal latch circuit Dk1, with the redundancy enable signal stored in the redundancy enable signal latch circuit Ek1 wherein k is an integer ranging from one to n, and outputs the comparison result.

The rescue determination output circuits 53d-1 to 53d-n determine whether or not the corresponding memory units 10-1 to 10-n are to be rescued, based on the comparison results from the comparison circuit units 52d-1 to 52d-n, respectively. The determination criterion used by each of the rescue determination output circuits 53d-1 to 53d-n is the same as used in the fifth embodiment.

Hereinafter, an operation performed by the semiconductor memory device 700 according to the seventh embodiment will be described with reference to FIG. 6. Power is turned off each time a voltage condition is changed, and the information stored in the first to the third latch circuits are erased. At the same time, the information stored in the redundancy enable signal transfer latch circuits 43-1 to 43-n are erased.

When a voltage condition is renewed, the rescue information transfer clock SCK indicating the start of testing is inputted to the non-volatile element section 4a. In response thereto, the non-volatile element section 4a transfers the storage information S4 stored in the electrical fuse element units 41-1 to 41-n, to the first latch circuit units 42-1 to 42-n, respectively. The non-volatile element section 4a may transfer only the redundancy enable signal to the redundancy enable signal transfer latch circuits 43-1 to 43-n without transferring the storage information S4 to the first latch circuit units 42-1 to 42-n.

Next, in synchronization with the rescue information transfer clock SCK, the rescue information S3 which is outputted by the redundancy rescue section 3d in series are stored in the first latch circuit units 42-1 to 42-n. At that time, the redundancy enable signals stored in the redundancy enable signal latch circuits L11 to Ln1 of the first latch circuit units 42-1 to 42-n are transferred, in parallel, to the redundancy enable signal transfer latch circuits 43-1 to 43-n, respectively, in accordance with a clock which is generated first. In accordance with a clock which is generated secondly and clocks subsequent thereto, the redundancy enable signals stored in the redundancy enable signal transfer latch circuits 43-1 to 43-n are sequentially stored in the redundancy enable signal latch circuits E11 to En1 of the third latch circuit units 51d-1 to 51d-n, respectively.

In accordance with a clock indicating that the redundancy enable signal stored in the electrical fuse element F11 is to be stored in the redundancy enable signal latch circuit E11, the redundancy rescue section 3d outputs the rescue information S7 in parallel. In response thereto, the second latch circuit units 50d-1 to 50d-n store the rescue information S7. A time at which the rescue information S7 is outputted from the redundancy rescue section 3d is not limited thereto.

When the rescue information S7 is stored in the second latch circuit units 50d-1 to 50d-n, and the storage information S8 is stored in the third latch circuit units 51d-1 to 51d-n, the comparison circuits C11 to Cn1 each perform comparison between the redundancy enable signals, and output the comparison result. The rescue determination output circuits 53d-1 to 53d-n determine whether or not the corresponding memory units 10-1 to 10-n, respectively, are to be rescued, and output the determination results as the rescue determination signals S5d-1 to S5d-n, respectively. The determination criterion used by each of the rescue determination output circuits 53d-1 to 53d-n is the same as used in the fifth embodiment. The non-volatile element section 4d determines whether or not the electrical fuse element units 41-1 to 41-n are to be disconnected, based on the rescue determination signals S5d-1 to S5d-n outputted by the rescue determination output circuits 53d-1 to 53d-n, respectively, and performs the disconnection as necessary.

As described above, the semiconductor memory device 700 according to the seventh embodiment compare the redundancy enable signal which is included in the rescue information based on a voltage condition having not been changed, with the redundancy enable signal which is included in the rescue information based on a new voltage condition, and writes information enabling the rescue under the new voltage condition, in the electrical fuse elements which are non-volatile elements. Thus, even when power is turned off each time a voltage condition is changed, testing for rescue can be performed. In addition, a time period in which information is transferred is shortened, resulting in a time period for rescue being shortened. At the same time, the number of the latch circuits, and the like can be reduced, thereby reducing a circuit scale.

Figure 7:
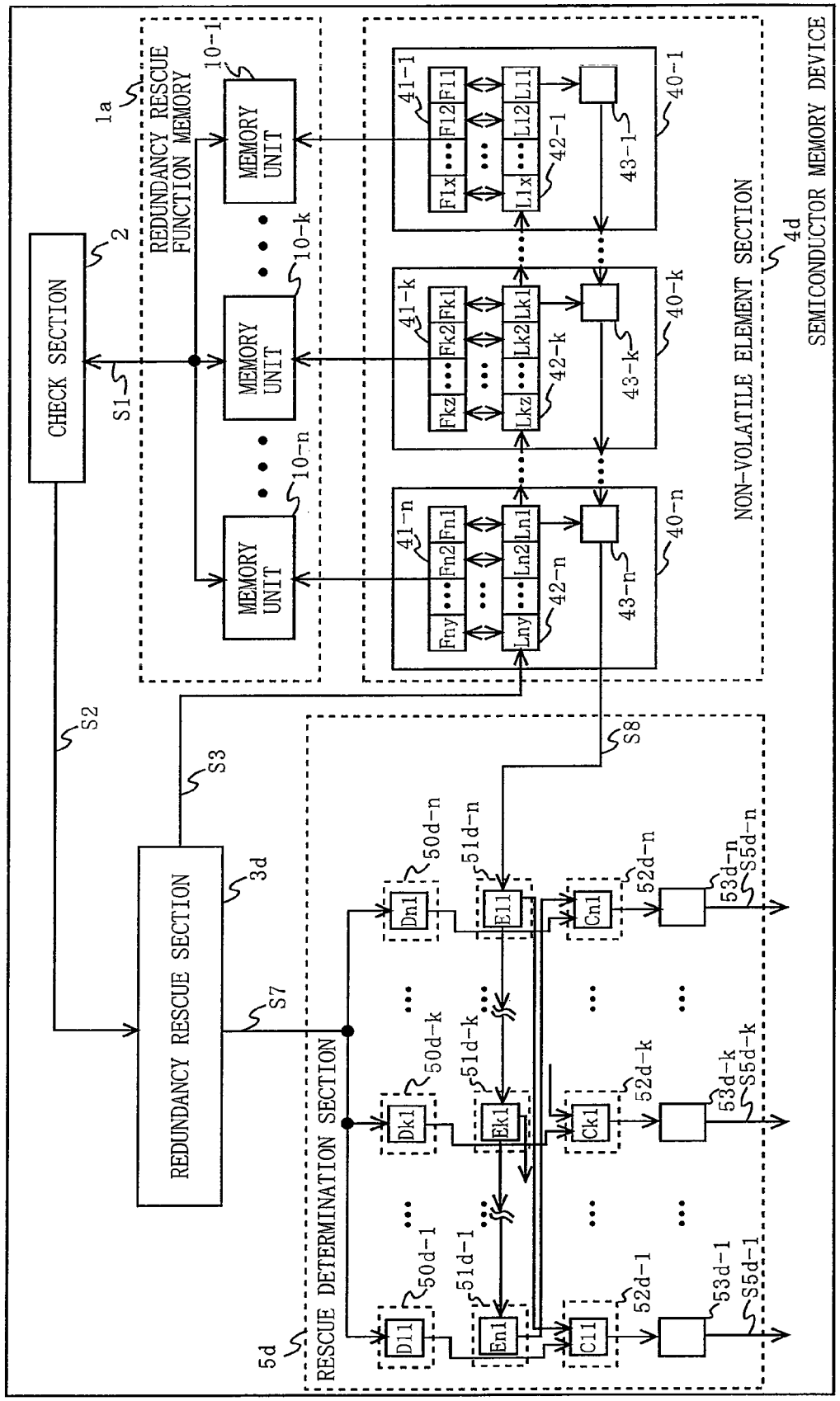
FIG. 7 is a block diagram illustrating a functional configuration of an exemplary modification of the semiconductor memory device 700 according to the seventh embodiment of the present invention.

As shown in FIG. 7, in the non-volatile element section 4d, the redundancy enable signal transfer latch circuits 43-1 to 43-n may be connected in chain with each other so as to transfer the redundancy enable signals to the rescue determination section 5d in the order starting from the redundancy enable signal having been most recently stored (that is, in a first-in last-out order). In this case, the order in which the redundancy enable signal latch circuits E11 to En1 are connected to each other is opposite to that shown in FIG. 6. That is, the redundancy enable signal latch circuits E11 to En1 are connected such that the redundancy enable signals are stored, in the redundancy enable signal latch circuits E11 to En1, respectively, in the order starting from the redundancy enable signal having been most recently stored in the non-volatile element section 4d. The comparison circuits C11 to Cn1 have leads extending from the redundancy enable signal latch circuits D11 to Dn1, and E11 to En1, respectively, such that each of the comparison circuits C11 to Cn1 is able to perform comparison between the corresponding redundancy enable signals, thereby comparison between the redundancy enable signals. The circuit configuration shown in FIG. 7 may also enable the same effect as obtained in the seventh embodiment.

Eighth Embodiment

Figure 8:
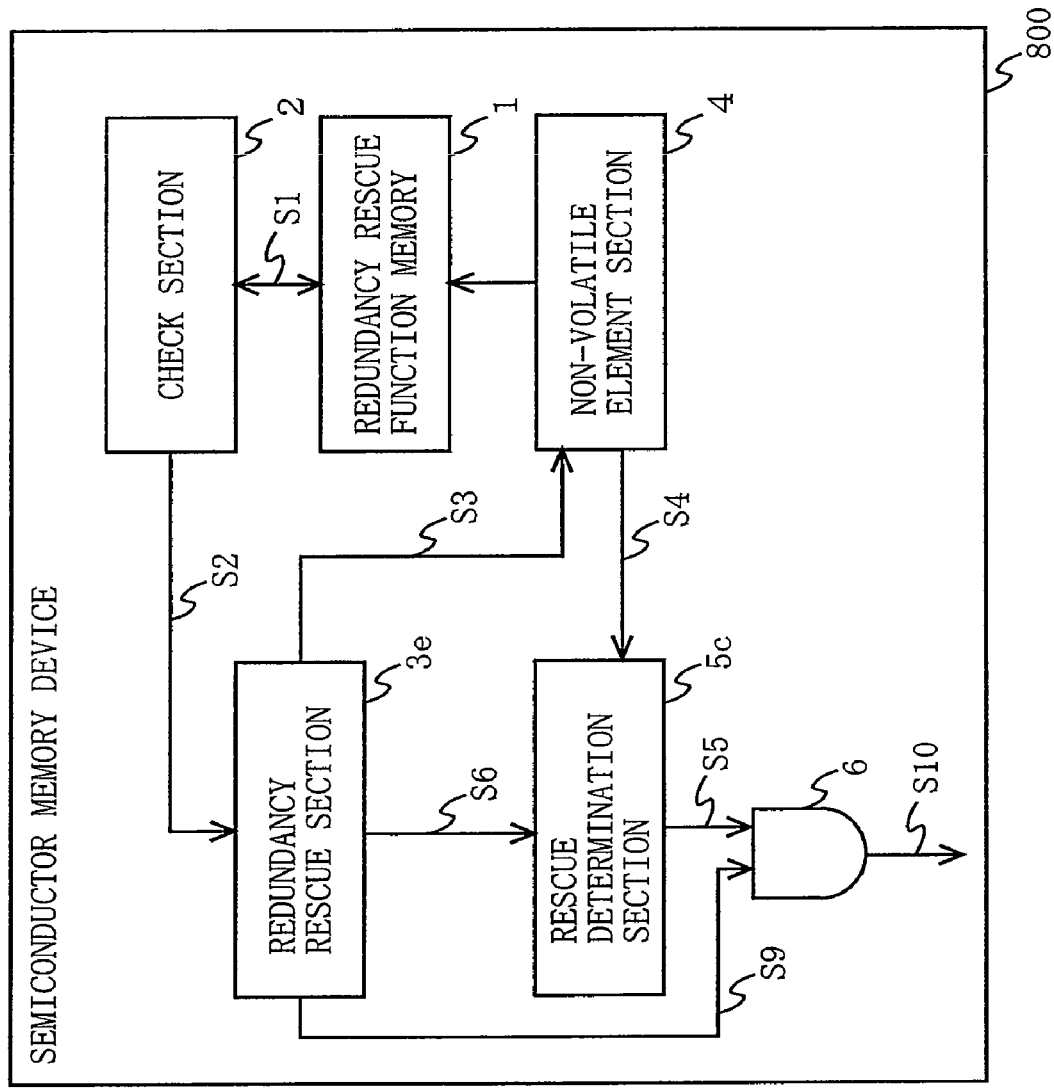
FIG. 8 is a block diagram illustrating a functional configuration of a semiconductor memory device 800 according to an eighth embodiment of the present invention.

FIG. 8 is a block diagram illustrating a functional configuration of a semiconductor memory device 800 according to an eighth embodiment of the present invention. In FIG. 8, components having the same functions as the components for the first and the sixth embodiments are denoted by the same reference numerals as used in the first and the sixth embodiments, and the description thereof is not given.

As shown in FIG. 8, the semiconductor memory device 800 includes the redundancy rescue function memory 1, the test section 2, a redundancy rescue section 3e, the non-volatile element section 4, the rescue determination section 5c, and a final determination section 6.

The redundancy rescue section 3e determines whether or not the main memory cell can be rescued, based on the test result information outputted by the test section 2, and outputs a rescue possibility determination signal S9. When the redundancy rescue section 3e determines that no means enables the main memory cell to be rescued, the redundancy rescue section 3e outputs the rescue possibility determination signal S9 indicating that the rescue is impossible.

When the rescue possibility determination signal S9 indicating that the rescue is impossible is inputted from the redundancy rescue section 3e under a certain voltage condition, the final determination section 6 outputs a final rescue determination signal S10 indicating that the semiconductor memory device 800 cannot be rescued, regardless of the rescue determination signal S5 inputted from the rescue determination section 5c. On the other hand, when the rescue possibility determination signal S9 indicating that the rescue is impossible is not inputted, the final determination section 6 outputs the final rescue determination signal S10 indicating that the rescue is possible, or that the rescue is impossible, in accordance with the rescue determination signal S5 from the rescue determination section 5c. The non-volatile element section 4 renews the storage information in accordance with the final rescue determination signal S10. When the final rescue determination signal S10 indicating that the rescue is possible under all the voltage conditions is outputted, the semiconductor memory device 800 rescues the main memory cell, in accordance with the storage information stored in the non-volatile element section 4. When the final rescue determination signal S10 indicating that the rescue is impossible is outputted, the semiconductor memory device 800 is handled as a faulty device.

The redundancy rescue section 3e and the final determination section 6 are each applicable to all the embodiments described herein.

As described above, in the eighth embodiment, when the memory unit which cannot be rescued is detected, no rescue processing is performed. Therefore, a meaningless rescue process is not performed for another memory unit. Therefore, the testing and the rescue process can be efficiently performed.

Ninth Embodiment

Figure 9:
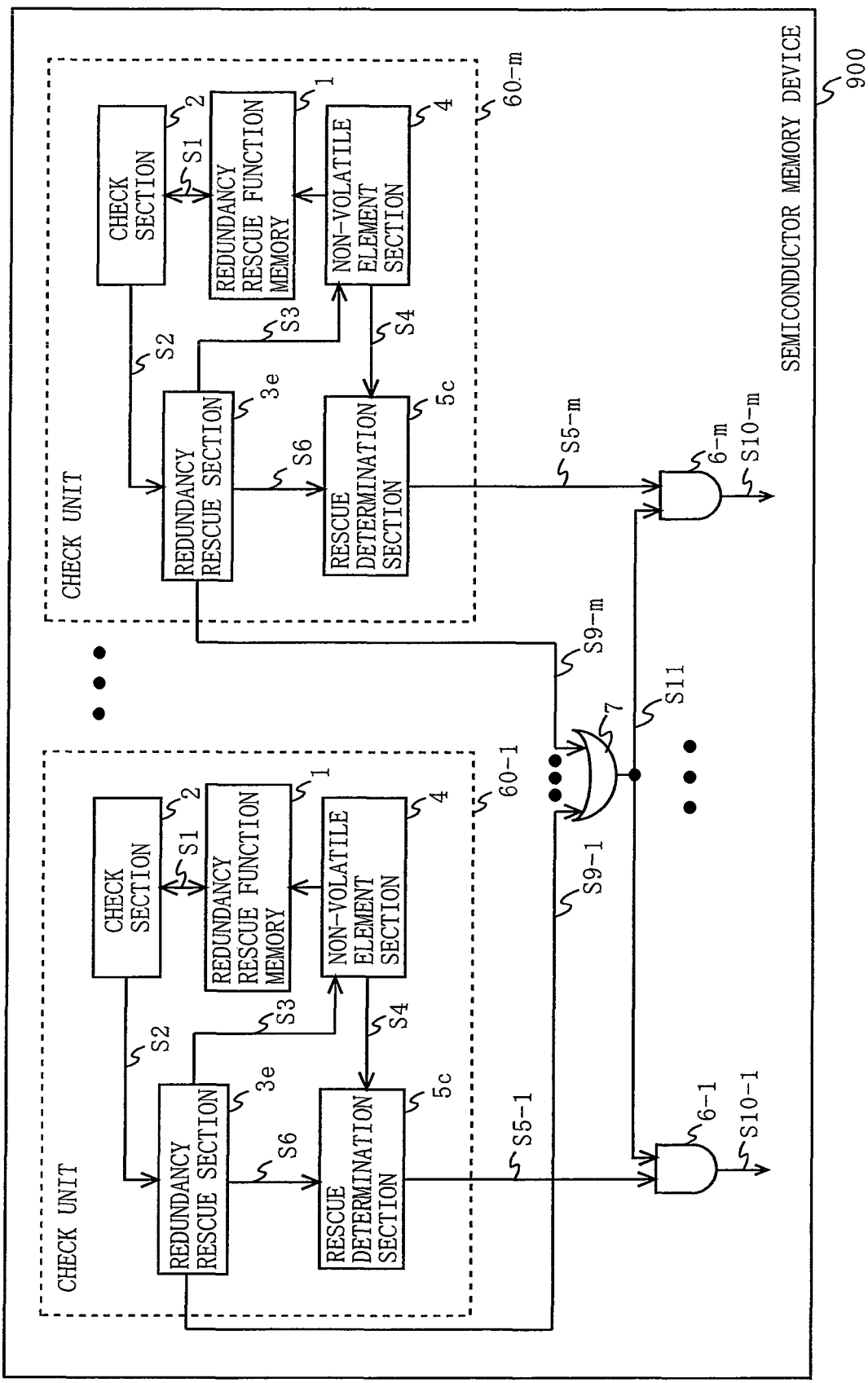
FIG. 9 is a block diagram illustrating a functional configuration of a semiconductor memory device 900 according to a ninth embodiment of the present invention.

FIG. 9 is a block diagram illustrating a functional configuration of a semiconductor memory device 900 according to a ninth embodiment of the present invention. In the ninth embodiment, components having the same functions as the components for the eighth embodiment are denoted by the same reference numerals as used in the eighth embodiment, and the description thereof is not given.

As shown in FIG. 9, the semiconductor memory device 900 includes test units 60-1 to 60-$m$, a chip level rescue possibility determination section 7, and final determination sections 6-1 to 6-$m$.

The test units 60-1 to 60-$m$ each includes the redundancy rescue function memory 1, the test section 2, the redundancy rescue section 3e, the non-volatile element section 4, and the rescue determination section 5c. The test units 60-1 to 60-$m$ are applicable to all the configurations of the semiconductor memory devices described herein. However, the rescue determination section of each of the test units 60-1 to 60-$m$ outputs the rescue possibility determination signal.

The rescue possibility determination signals S9-1 to S9-$m$ outputted by the redundancy rescue sections 3e, respectively, are inputted to the chip level rescue possibility determination section 7. The chip level rescue possibility determination section 7 determines that the semiconductor memory device 900 cannot be rescued when at least one of the rescue possibility determination signals S9-1 to S9-$m$ indicates, under a certain voltage condition, that the rescue is impossible. On the other hand, when all the rescue possibility determination signals S9-1 to S9-$m$ indicate that the rescue is possible, the chip level rescue possibility determination section 7 determines that the semiconductor memory device 900 can be rescued. The chip level rescue possibility determination section 7 outputs the determination result as a chip level rescue possibility determination signal S11.

When the chip level rescue possibility determination signal S11 indicating the rescue is impossible is outputted by the chip level rescue possibility determination section 7, the final determination sections 6-1 to 6-$m$ output final rescue determination signals S10-1 to S10-$m$, respectively, each indicating that the rescue is impossible. In accordance therewith, the semiconductor memory device 900 does not perform subsequent testings. On the other hand, when the chip level rescue possibility determination signal S11 indicating that the rescue is possible is outputted, the final determination sections 6-1 to 6-$m$ output the final rescue determination signals S10-1 to S10-$m$, respectively, each indicating that the rescue is possible. In accordance therewith, each non-volatile element section 4 renews the storage information. When the final rescue determination signals S10-1 to S10-$m$ each indicating that the rescue is possible are outputted under all the voltage conditions, each redundancy rescue function memory 1 performs rescue processing based on the storage information.

As described above, according to the ninth embodiment, when a faulty memory unit which cannot be rescued exists, no rescue processing is performed, thereby enhancing efficiency for testing memories.

Tenth Embodiment

A tenth embodiment of the present invention will be described with reference to FIG. 3. In the tenth embodiment, the number of the electrical fuse elements is the same among the electrical fuse element units 41-1 to 41-n (that is, the number is always x), even when the memory units 60-1 to 60-n have configurations different from each other. At the same time, the number of latch circuits is the same among the first latch circuit units 42-1 to 42-n, the second latch circuit units 50-1 to 50-n, and the third latch circuit units 51-1 to 51-n (that is, the number is always x). Further, the number of comparison circuits is the same among the comparison circuit units 52-1 to 52-n (that is, the number is always x).

Thus, the number of times the rescue information transfer clock SCK is generated for transferring the rescue information S3 from the redundancy rescue section 3 may be n×x. Therefore, in the tenth embodiment, the number of components is constant even when the memory units have memory configurations different from each other. Therefore, the number of times the rescue information transfer clock SCK necessary for transferring the rescue information is generated can be easily set to n×x. Therefore, it is possible to minimize an error caused when the same number of clocks are generated.

While the invention has been described in detail, the foregoing description is in all aspects illustrative and not restrictive. It is understood that numerous other modifications and variations can be devised without departing from the scope of the invention.

What is claimed is:

1. A semiconductor memory device comprising:
   a redundancy rescue function memory including a main memory cell and a spare memory cell for rescuing the main memory cell, wherein, when the main memory cell is a faulty memory cell, the faulty memory cell is replaced with the spare memory cell so as to rescue the main memory cell;
   a test section operable to test the main memory cell;
   a redundancy rescue section operable to output rescue information associated with rescue of the main memory cell, in accordance with a test result from the test section;
   a non-volatile element section operable to store information necessary for rescuing the main memory cell, as storage information, in a non-volatile element; and
   a rescue determination section operable to determine, when the rescue information is newly outputted by the redundancy rescue section, whether or not the main memory cell is to be rescued, based on the storage information stored in the non-volatile element section, and the rescue information which is newly outputted,
   wherein the non-volatile element section renews the storage information based on a determination result from the rescue determination section.

2. The semiconductor memory device according to claim 1, wherein the non-volatile element section further includes a volatile element operable to store the rescue information outputted by the redundancy rescue section, and
   wherein the non-volatile element section stores, based on a determination result from the rescue determination section, the rescue information stored in the volatile element, as the storage information, in the non-volatile element.

3. The semiconductor memory device according to claim 2, wherein the non-volatile element is an electrical fuse element.

4. The semiconductor memory device according to claim 1, wherein the rescue information outputted by the redundancy rescue section includes at least
   rescue address information associated with an address of the faulty memory cell which is to be replaced with the spare memory cell, and
   a redundancy enable signal indicating whether or not rescue is possible.

5. The semiconductor memory device according to claim 4, wherein the rescue determination section determines whether or not the main memory cell is to be rescued, based on the redundancy enable signal included in the rescue information which is newly outputted, and the redundancy enable signal included in the storage information.

6. The semiconductor memory device according to claim 4, wherein the non-volatile element section further includes a first volatile element operable to store the storage information stored in the non-volatile element,
   wherein the redundancy rescue section outputs the rescue information in series in synchronization with a predetermined clock,
   wherein the non-volatile element section outputs, in series, the storage information stored in the first volatile element while storing, in the first volatile element, the rescue information outputted by the redundancy rescue section in synchronization with the predetermined clock, and
   wherein the rescue determination section includes:
      a second volatile element operable to store, in synchronization with the predetermined clock, the rescue information outputted by the redundancy rescue section;
      a third volatile element operable to store the storage information outputted by the non-volatile element section;
      a comparison circuit operable to compare the rescue information stored in the second volatile element, with the storage information stored in the third volatile element; and
      a rescue determination output section operable to determine whether or not the main memory cell is to be rescued, based on a comparison result from the comparison circuit, and output a determination result.

7. The semiconductor memory device according to claim 6, wherein the non-volatile element section transfers, in series, the storage information stored in the first volatile element to the third volatile element in a first-in first-out order.

8. The semiconductor memory device according to claim 6, wherein the comparison circuit compares the redundancy enable signal which is included in the rescue information stored in the second volatile element, with the redundancy enable signal which is included in the storage information stored in the third volatile element.

9. The semiconductor memory device according to claim 1, wherein the rescue information outputted by the redundancy rescue section includes at least one of
   rescue address information associated with an address of the faulty memory cell which is to be replaced with the spare memory cell, and
   a redundancy enable signal indicating whether or not rescue is possible,
   wherein the redundancy rescue section outputs, in series, the rescue information including the rescue address information and the redundancy enable signal, and outputs, in parallel, the rescue information including the redundancy enable signal, and
   wherein the rescue determination section determines whether or not the main memory cell is to be rescued, based on the rescue information which is outputted by the redundancy rescue section in parallel, and the redundancy enable signal included in the storage information.

10. The semiconductor memory device according to claim 9, wherein the non-volatile element section further includes:
    a first volatile element operable to store the rescue information which is outputted by the redundancy rescue section in series; and
    a second volatile element operable to store the redundancy enable signal which is included in the storage information stored in the non-volatile element,
wherein the rescue determination section includes:
    a third volatile element operable to store the rescue information which is outputted by the redundancy rescue section in parallel;
    a fourth volatile element operable to store the redundancy enable signal stored in the second volatile element;
    a comparison circuit operable to compare the redundancy enable signal which is included in the rescue information and stored in the third volatile element, with the redundancy enable signal stored in the fourth volatile element; and
    a rescue determination output circuit operable to determine whether or not the main memory cell is to be rescued, based on a comparison result from the comparison circuit, and output a determination result.

11. The semiconductor memory device according to claim 10, wherein the redundancy enable signal stored in the second volatile element is transferred to the fourth volatile element.

12. The semiconductor memory device according to claim 11, wherein the redundancy enable signal stored in the second volatile element is transferred to the fourth volatile element in a first-in last-out order.

13. The semiconductor memory device according to claim 1,
    wherein the redundancy rescue section outputs a rescue possibility determination signal indicating whether or not the main memory cell can be rescued,
    the semiconductor memory device further comprises a final determination section operable to determine that the main memory cell is not to be rescued, regardless of a determination result from the rescue determination section, when the rescue possibility determination signal indicating that rescue is impossible is outputted by the redundancy rescue section.

14. The semiconductor memory device according to claim 6, wherein the first volatile element, the second volatile element, and the third volatile element have a same number of storage elements.

15. A semiconductor memory device comprising;
    test units each including a redundancy rescue function memory including a main memory cell and a spare memory cell for rescuing the main memory cell, wherein, when the main memory cell is a faulty memory cell, the faulty memory cell is replaced with the spare memory cell so as to rescue the main memory cell;
    a chip level rescue possibility determination section operable to determine whether or not the semiconductor memory device as a whole is to be rescued, based on a rescue possibility determination signal indicating whether or not the main memory cell can be rescued, the rescue possibility determination signal being outputted by each of the test units,
wherein each of the test units further includes:
    a test section operable to test the main memory cell;
    a redundancy rescue section operable to output rescue information associated with rescue of the main memory cell, in accordance with a test result from the test section;
    a non-volatile element section operable to store information necessary for rescuing the main memory cell, as storage information, in a non-volatile element; and
    a rescue determination section operable to determine, when the rescue information is newly outputted by the redundancy rescue section, whether or not the main memory cell is to be rescued, based on the storage information stored in the non-volatile element section, and the rescue information which is newly outputted,
wherein the non-volatile element section renews the storage information based on a determination result from the rescue determination section, and
wherein the chip level rescue possibility determination section determines that the semiconductor memory device as a whole is not to be rescued, when at least one of the test units outputs the rescue possibility determination signal indicating that rescue is impossible.

* * * * *